US008461856B2

(12) United States Patent
Ostmeier

(10) Patent No.: US 8,461,856 B2
(45) Date of Patent: Jun. 11, 2013

(54) INTERFACE TEST DEVICE AND METHOD FOR USING THE INTERFACE

(76) Inventor: Hubert Ostmeier, Bonn (DE)

( * ) Notice: Subject to any disclaimer, the term of this patent is extended or adjusted under 35 U.S.C. 154(b) by 477 days.

(21) Appl. No.: 12/660,042

(22) Filed: Feb. 20, 2010

(65) Prior Publication Data

US 2011/0089961 A1 Apr. 21, 2011

Related U.S. Application Data

(60) Provisional application No. 61/279,304, filed on Oct. 19, 2009.

(51) Int. Cl.
*G01R 31/00* (2006.01)
(52) U.S. Cl.
USPC ............... 324/756.05; 324/522; 439/188
(58) Field of Classification Search
None
See application file for complete search history.

(56) References Cited

U.S. PATENT DOCUMENTS

| 1,887,421 | A | * | 11/1932 | Newman ........................ 200/2 |
| 5,071,362 | A | | 12/1991 | Martens et al. |
| 5,286,215 | A | * | 2/1994 | Dewey et al. ................ 439/188 |
| 5,533,907 | A | | 7/1996 | Kozel et al. |
| 5,601,442 | A | | 2/1997 | Harting et al. |
| 5,788,520 | A | | 8/1998 | Roche |
| 5,899,764 | A | | 5/1999 | Harting et al. |
| 6,099,333 | A | * | 8/2000 | Daoud et al. ................ 439/188 |
| 6,244,881 | B1 | * | 6/2001 | Hara ............................. 439/188 |
| 6,257,910 | B1 | | 7/2001 | Mramor |
| 6,609,920 | B2 | | 8/2003 | Koyasu |
| 6,796,803 | B2 | | 9/2004 | Abe |
| 6,888,078 | B2 | | 5/2005 | Loeffelholz et al. |
| 7,271,357 | B2 | | 9/2007 | Ostmeier |
| 7,666,037 | B2 | | 2/2010 | Diessel |

FOREIGN PATENT DOCUMENTS

| DE | 17 98 757 | 10/1959 |
| DE | 102 16 913 A1 | 5/2003 |
| DE | 10 2005 025 108.0 B3 | 7/2006 |
| EP | 0 386 742 A1 | 9/1990 |

* cited by examiner

*Primary Examiner* — Richard Isla Rodas
(74) *Attorney, Agent, or Firm* — Von Rohrscheldt Patents

(57) ABSTRACT

A monitored test block for use in medium and high voltage electrical monitoring circuits such as found in substation facilities that signals via a communication protocol the operational status of potential, current and signal secondary circuits when connected to protection and monitoring devices (or test devices) such as protective relays, fault recorders or any other monitoring and controlling device. The monitored test block includes various safety features to prevent damage to the equipment or harm to a technician. The monitoring circuits may be located in the front for ease of access.

22 Claims, 14 Drawing Sheets

US 8,461,856 B2

INTERFACE TEST DEVICE AND METHOD FOR USING THE INTERFACE

This patent application claims priority of and incorporates by reference U.S. provisional patent application 61/279,304, filed on Oct. 19, 2009.

FIELD OF THE INVENTION

The present invention relates generally to an interface test device and method that opens a medium to high voltage circuit, and more specifically to an interface test device and method that opens a medium to high voltage monitoring circuit where the interface test device is monitored and/or is configured to prevent accidental damage to the medium to high voltage monitoring circuit during maintenance and/or allows for maintenance of certain components without taking the medium to high voltage monitoring circuit off line.

BACKGROUND OF THE INVENTION

Most of the components of power system generation, transmission or distribution facilities, such as transmission lines, step-up and step-down transformers, power breakers and generators are monitored and controlled. The control and monitoring is usually performed by electromechanical or electronic equipment that are able to measure electrical quantities, perform calculations based on pre-defined algorithms and thresholds and actuate the system when necessary. Due to the high voltage, current and power flowing through the high-power components, current transformers, potential transformers and breakers are employed as an interface between the high-power components and the low-power control and monitoring devices such as a medium to high voltage monitoring circuit. This medium to high voltage monitoring circuit and its associated circuitry are tested by technicians. For example, a technician might test the operation of a medium to high voltage monitoring circuit or its associated circuitry by inserting a test plug into an interface test device and performing various tests. Unfortunately, it is inevitable that mistakes happen during such testing which results in damage to the equipment or harm to the technician. During such testing, the technician might also adjust the medium to high voltage monitoring circuit by changing the parameters of the medium to high voltage monitoring circuit based upon the testing or based upon other factors. Unfortunately, such testing and adjustments take substantial amounts of the technician's time which is expensive. Furthermore, it is typical to perform period maintenance on the circuitry of the medium to high voltage monitoring circuits. In order to perform maintenance on medium to high voltage monitoring circuits, the associated power circuits must be powered down to allow the technician to perform the maintenance since the interface or other components in the medium to high voltage monitoring circuit might otherwise be damaged. These interruptions in operation of the medium to high voltage monitoring circuit and in the power circuit increase the cost of operation. For example, there are costs associated with switching to another power circuit and there are costs associated with the lost usage of the equipment powered by the power circuit. Accordingly, there is a strong need in the art to improve medium to high voltage monitoring circuits and their associated circuitries to reduce or eliminate the aforementioned drawbacks.

SUMMARY OF THE INVENTION

The invention relates to an interface test device for testing a circuit, the interface test device comprising: a module configured to open and close a medium to high voltage monitoring circuit, the module having at least one pair of contacts biased towards each other that are electrically connected and in line with a medium to high voltage monitoring circuit; and a detector, and a second circuit; wherein the second circuit is connected at least to a portion of the medium to high voltage monitoring circuit before or substantially simultaneously with the medium to high voltage monitoring circuit being opened; wherein the module is configured to provide at least one output based upon at least one parameter of the medium to high voltage monitoring circuit by measuring at least one parameter of the second circuit; and wherein the detector determines whether the at least one pair of contacts are in conductive contact with each other and provides a detector output indicating whether the at least one pair of contacts are in conductive contact with each other such that when the at least one pair of contacts changes from being in conductive contact with each other to not being in conductive contact with each other or changes from not being in conductive contact with each other to being in conductive contact with each other the detector changes the detector output. The invention also relates to an interface test device for testing a circuit, the interface test device comprising: a module configured to open and close a medium to high voltage monitoring circuit, the module having at least one pair of contacts biased towards each other that are electrically connected and in line with a medium to high voltage circuit; and monitoring circuitry, and a second circuit; wherein the second circuit is connected at least to a portion of the medium to high voltage monitoring circuit before or substantially simultaneously with the medium to high voltage monitoring circuit being opened; wherein the module is configured to provide at least one output based upon at least one parameter of the medium to high voltage monitoring circuit by measuring at least one parameter of the second circuit.

BRIEF DESCRIPTION OF THE DRAWINGS

The invention will be described in detail with reference to the following drawings in which like reference numerals refer to like elements wherein:

FIG. 15 illustrates another exemplary embodiment of the interface module with a breaker finger that moves within the interface module but cannot be removed from the interface module that has a breaker finger pulled out and the shorting contact slide pushed in.

DETAILED DESCRIPTION

Figure 1:
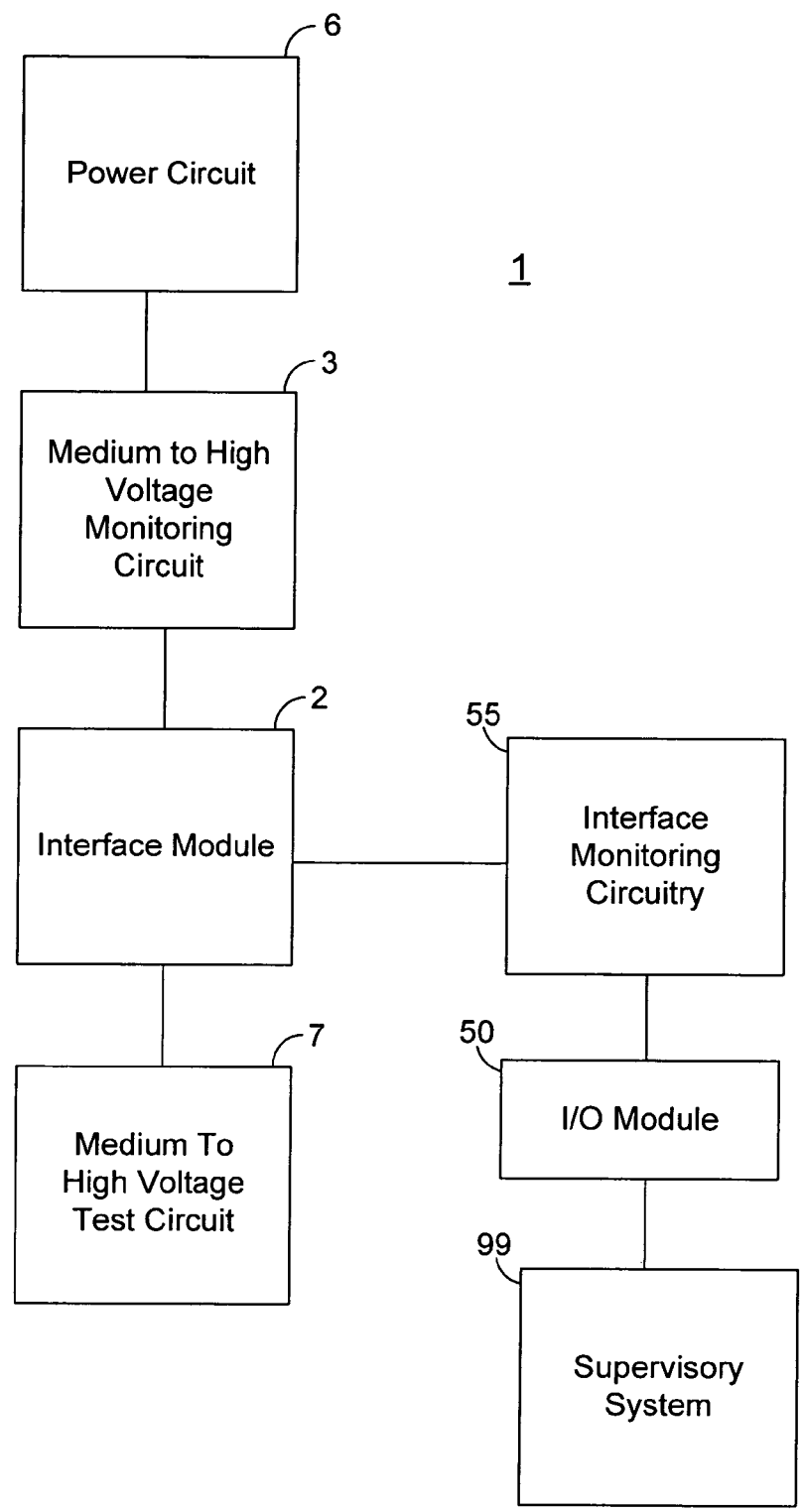
FIG. 1 shows a block diagram of an exemplary interface test device according to an embodiment of the invention.

Monitoring of interface test devices for medium to high voltage circuits and systems according to an exemplary embodiment of the invention may be implemented in an automated manner to provide for more continuous and comprehensive monitoring, greater efficiency and safety, reduced costs associated with the monitoring, as well as other advantages. Furthermore, the circuitry used in monitoring and control of an interface test device also may be configured such that maintenance on the medium to high voltage monitoring circuit is able to be performed safely and efficiently without taking the medium to high voltage monitoring circuit off line. With such monitoring circuitry incorporated into the medium to high voltage monitoring circuit, disruptive maintenance may be avoided because the medium to high voltage monitoring circuit does not need to be taken off line during testing and servicing of the medium to high voltage monitoring circuitry which means the servicing is performed without interrupting the medium to high voltage monitoring circuit. This improves efficiency and eliminates the problems that would otherwise be caused by these service interruptions.

The interface test device according to an embodiment of the invention also may be implemented such that when a test plug (either one that is inserted into an aperture of the interface module or one that is integrally formed with the interface module) opens the medium to high voltage monitoring circuit, the medium to high voltage monitoring circuit is protected. For example, when a medium to high voltage monitoring circuit is coupled to a power circuit through a transformer with one coil in the power circuit and the other coil in the medium to high voltage monitoring circuit, the medium to high voltage monitoring circuit cannot be opened without the risk of damaging the coil disposed therein. In order to open the medium to high voltage monitoring circuit for maintenance, the power circuit would have to be shut down because otherwise the primary transformer coil in the power circuit will attempt to continue driving current across the effectively infinite impedance of the secondary transformer coil and will produce high voltage across the open secondary transformer coil that can damage components and endanger operators. To avoid such problems, the test plug may be configured to make another circuit before the medium to high voltage circuit is opened. Such a system may be implemented with an automated monitoring system for the interface module or may be implemented with a monitoring system for the interface module that is not automated. Similarly, other elements including potential transformers and breakers also are protected.

The interface test device also may be implemented such that to detect whether a foreign object has been inserted into a test plug aperture. This helps detect undesirable openings of the medium to high voltage monitoring circuits that might be difficult to detect otherwise. For example, such an interface test device could detect the presence of a test plug that has fallen apart or detect sabotage such as a flat piece of plastic or cardboard inserted between contacts of the medium to high voltage monitoring circuit such that the medium to high voltage monitoring circuit is opened.

FIG. 1 shows a block diagram of an exemplary interface test device 1 according to an embodiment of the invention. The interface test device 1 includes a power circuit 6 monitored by a medium to high voltage monitoring circuit 3, an interface module 2 to connect the medium to high voltage monitoring circuit 3 to a test circuit 7, interface monitoring circuitry 55 for monitoring the interface module 2 and connected to a supervisory system 99 via an I/O module 50. The interface monitoring circuitry 55 monitors the status of the interface module 2 and signals the status of the interface module 2 to the supervisory system 99 via the I/O module 50. The I/O module 50 facilitates communication between the interface module 2 and the supervisory system by receiving signals from the interface module 2, typically via a wired connection and in turn transmits those signals to the supervisory system 99, with or without some processing. The transmission from the I/O module 50 may be through a wired connection, an optical connection, a radio signal connection, combinations of different connections or any other suitable transmission medium. Alternatively, the I/O module 50 may be omitted and the interface module 2 and the supervisory system 99 may be directly connected.

The signaling can be done via a standard communication protocol such as DNP3, MODBUS and IEC 61850, or a custom communications protocol. The use of such protocols allows monitoring, protection and testing devices to incorporate more intelligent features such as the broadcasting of status information to a myriad of other devices interconnected in a communication network. Furthermore, mistakes and other problems during test operation, such as leaving a current transformer circuit open, may be avoid by using monitored test blocks according to the embodiments of the invention because these test blocks are able to communicating with the supervisory system 99 via a suitable protocol which can warn a technician or even automatically adjust, shut down or otherwise actuate the circuits. Although one exemplary set of connections is shown, others may also be implemented. Furthermore, additional controls and features may be added.

Figure 2:
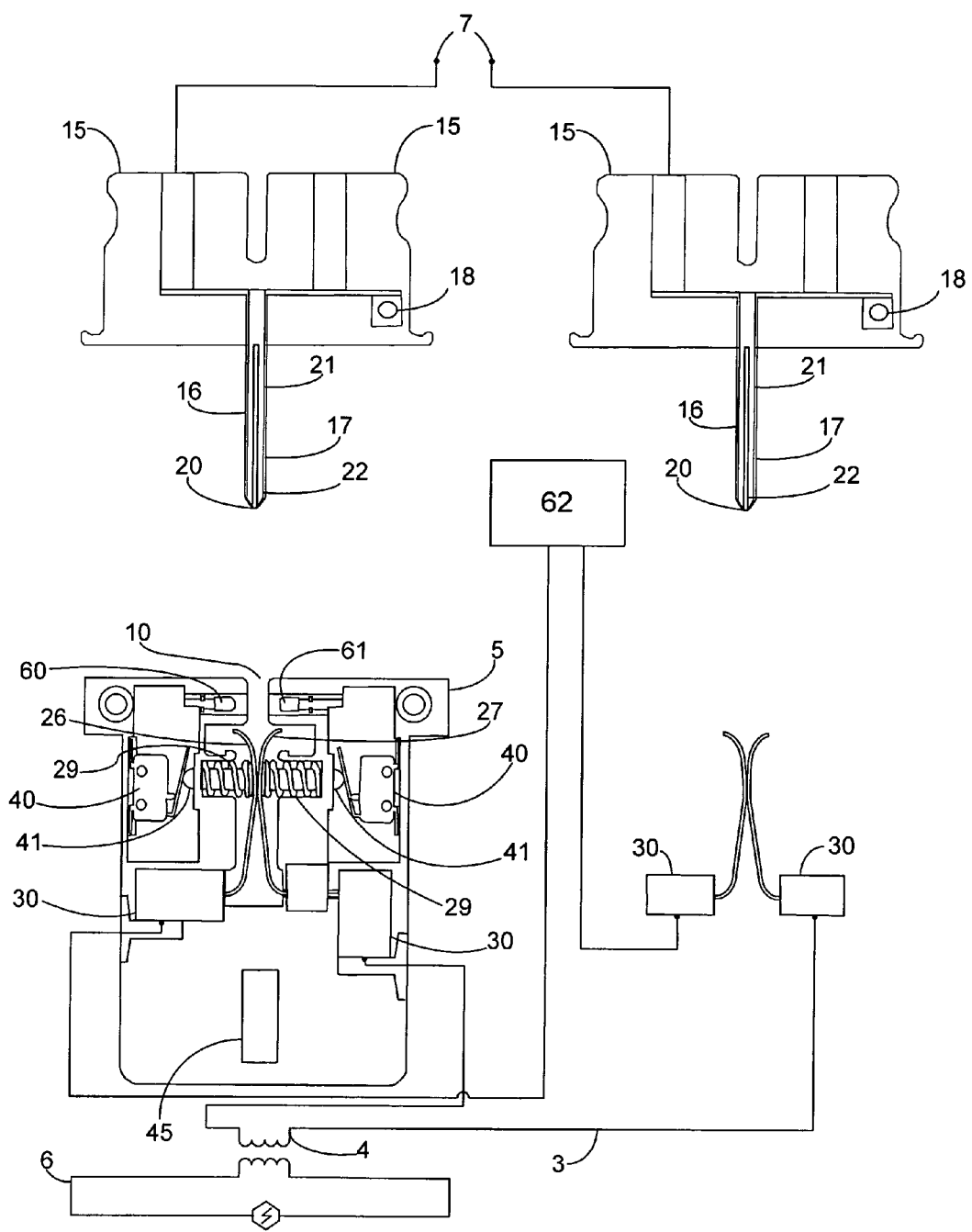
FIG. 2 illustrates an embodiment of the interface test device including two interface modules, each interface module with a test plug and a test block where the test plug is not inserted into the test block.

FIG. 2 illustrates an embodiment of the interface test device 1 including an interface module 2 with two test plugs 15 (also known as test paddles) and two test blocks 5 (also known as test switches or disconnect devices) where the test plugs 15 are not inserted into the test blocks 5. The interface test device 1 of FIG. 2 includes a medium to high voltage monitoring circuit 3, a monitoring component 4, a power circuit 6, a test circuit 7, an aperture 10, two test plug B-side contacts 16, two test plug A-side contacts 17 (test plug B-side contact 16 and test plug A-side contact 17 are collectively referred to as a pair of test plug contacts 16, 17), two shorting bars 18, two fingers 20, two insulators 21, two keying features 22, two test block B-side biased contacts 26, two test block A-side biased contacts 27 (test block B-side biased contact 26 and test block A-side biased contact 27 are collectively referred to as a pair of biased contacts 26, 27 and may be formed from a high-quality silver-plated copper contacts, high-quality gold plated copper contacts or any other suitable material or materials), biasing springs 29, terminals 30, at least one disconnect link 40, at least one disconnect link actuator 41, a light source 60 such as a light emitting diode, a light sensor 61 and a piece of equipment 62, e.g. a relay to be tested. The two test blocks are used in series. The second test block, which is only partially shown on the right side of FIG. 2 is configured identical to the fully shown test block. The first and the second test plugs, which are only partially shown on the right side of FIG. 2 and which are identical to the fully illustrated test plug, can be used to isolate and test the piece of equipment 62 or the entire circuit 3. The test plugs 15 may be shaped such that only suitable test plugs 15 will mate with the test blocks 5 via apertures 10 with an optional keying feature 22 on fingers 21. This keying feature 22 prevents inadvertent insertion of unsuitable test plugs that can damage the interface module 2 or other devices and harm the person inserting the unsuitable test plug. Suitable test plugs 15 break the medium to high voltage monitoring circuit 3 and connect the test circuit 7 with the medium to high voltage monitoring circuit 3 substantially simultaneously. This prevents the medium to high voltage monitoring circuit 3 from ever being interrupted and thus prevents any of the problems that would otherwise result from such an interruption. The test plugs 15 can be inserted into the test blocks 5 for testing potential, current, and signal disconnect links, thereby providing electrical access to all poles on both sides of the test block 5. The simple, safe, and efficient design of the interface test device provides access to in-service currents without interrupting the current path prior or during test plug insertion.

Additionally, the keying feature 22 assures the various contacts are properly matched such that the test block B-side biased contact 26 is connected to the test plug B-side contact 16 and the test block A-side biased contact 27 is connected to the test plug A-side contact 17. The insulator 21 is disposed between the test plug B-side contact 16 and the test plug A-side contact 17. In other words, the finger 20 includes a keying feature 22 that engages the aperture 10 of the test block 5 such that the finger 20 can only be inserted into the aperture 10 in one orientation and the test plug B-side contact 16 of the test plug 15 connects to the test block B-side biased contact 26 of the test block 5 and the test plug A-side contact 17 of the test plug 15 connects to the test block A-side biased contact 27 of the test block 5 such that a connection with the correct polarity is assured.

The medium to high voltage monitoring circuit 3 is coupled to the power circuit 6 through a monitoring component 4. The pairs of biased contacts 26, 27 are connected to the medium to high voltage monitoring circuit 3 through terminals 30. The test plug 15 includes a finger 21 supporting the pair of test plug contacts 16, 17 configured to connect to the pair of biased contacts 26, 27 of the medium to high voltage monitoring circuit 3. The pair of test plug contacts 16, 17 are connected to the test circuit 7, for testing the medium to high voltage monitoring circuit 3 including the monitoring component 4 and the piece of equipment 62. The test block 5 and the test plug 15 including the finger 21 may be formed from impact resistant insulator material, such as a plastic (e.g. polypropylene or polyethylene) or any other suitable material that will mechanically support and insulate components of the medium to high voltage monitoring circuit 3 and of the test circuit 7. The materials of the test block 5 may be clear so as to assist in maintenance, detection or sabotage or the like or may be opaque.

The medium to high voltage monitoring circuit 3 operates a monitoring component 4, such as a secondary coil of a transformer, which is used for monitoring a power circuit 6 with the primary coil disposed in the power circuit 6 and the secondary coil disposed in the medium to high voltage monitoring circuit 3 and couples the medium to high voltage monitoring circuit 3 to the power circuit 6. This protects the monitoring and control components 4 from damage because the higher voltages and/or currents in the power circuit 6 would damage or destroy the monitoring and control components 4 in the medium to high voltage monitoring circuit 3 if directly applied. For example, a current transformer may be used to monitor the power circuit 6 when the current and/or voltage in the power circuit 6 is too high to directly apply to measuring instruments in the medium to high voltage monitoring circuit 3 or in the test circuit 7. A current transformer and/or other elements may be used to produce a reduced current that is accurately proportional to the current in the power circuit 6 that can be conveniently connected to measuring and recording instruments in the medium to high voltage monitoring circuit 3 and in the test circuit 7. For example, the secondary winding of a current transformer should not be disconnected from its load while current is flowing in the primary winding in the power circuit 6, as the current transformer will attempt to continue driving current across the effectively infinite impedance and produce a very high voltage (into the range of several kilovolts in some cases) in the secondary current transformer coil that can permanently damage the current transformer such that either the current transformer no longer functions or is no longer an accurate indicator for the power circuit 6, and the very high voltage can compromise operator and equipment safety.

The test block 5 includes an aperture 10 configured to receive a finger 20 of the test plug 15. The test block 5 also houses a pair of biased contacts 26, 27 that act as disconnect links that normally connect the medium to high voltage monitoring circuit 3 to external terminals 30. Each disconnect link is connected in series through a rear circuit board 45 that forms at least part of the interface monitoring circuitry 55. Monitoring is typically performed using normally-closed contacts, wetted internally by a low-current power supply. Any failure of any monitoring contact, internal wiring or wetting current will cause a false "open" alarm. The rear circuit board 45 does not interfere in the disconnect link circuitry and can be replaced at any time. The terminals 30 may be made of conductive metal material such as brass, copper or any other suitable material. The terminals 30 may be configured to receive standard connectors or other connectors. The finger 20 may be made of impact resistant insulator material such as polypropylene, polyethylene or any other suitable material, and the finger may be configured to insulate against the voltages of the medium to high voltage monitoring circuit 3. As illustrated in FIG. 2, the pair of biased contacts 26, 27 in the test block 5 are in the closed position. In the closed position, the pair of biased contacts 26, 27 are securely pressed together by their own tension and may be additionally pressed together by one or two biasing springs 29 acting substantially against the opening direction of the pair of biased contacts 26, 27 and exerting force from one or both sides to create a constant contact pressure that minimizes internal resistance (e.g., to less than or equal to 2 mΩ). The pair of biased contacts 26, 27 may be spread apart and disconnected from one another by insertion of the finger 20 of the test plug 15 between the pair of biased contacts 26, 27.

Figure 3:
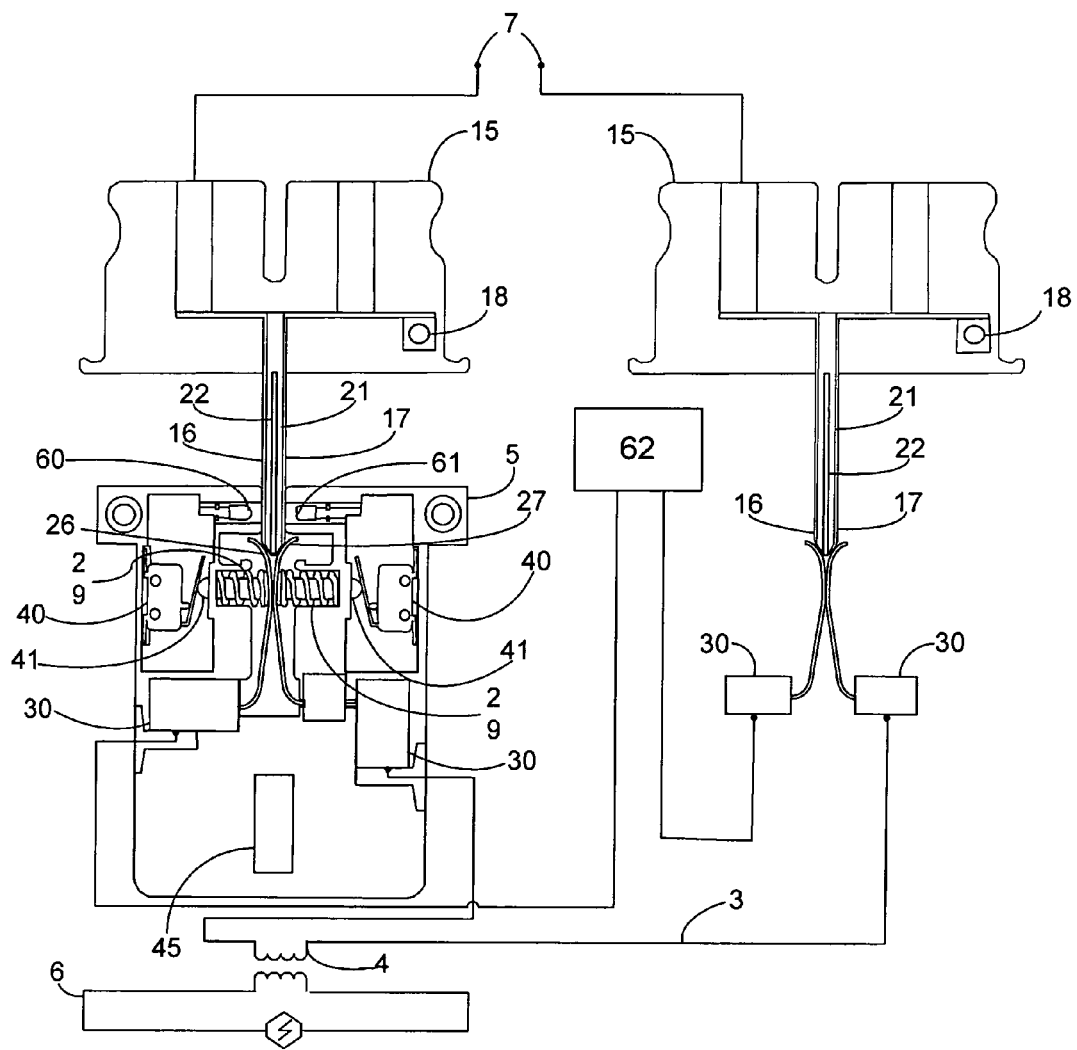
FIG. 3 illustrates an embodiment of the interface test device where the test plugs are partially inserted into the test blocks.

FIG. 3 illustrates an embodiment of the interface test device 1 where the test plugs 15 are partially inserted into the test blocks 5. Specifically, the test plugs 15 have been inserted into apertures 10 of the test blocks 5 where the pair of test plug contacts 16, 17 contact the pair of biased contacts 26, 27 but do not cause the pair of biased contacts 26, 27 to separate. The pair of test plug contacts 16, 17 being in contact with the pair of biased contacts 26, 27 ground the medium to high voltage monitoring circuit 3 through the test plug A-side contacts 17 of the test plugs 15 and the shorting bars 18, which act as a safety precaution to protect the monitoring circuit 3 and the test circuit 7 and helps to prevent an electric arc from forming when the contacts 26, 27 are opened. Additionally, each interface module 2 may include one or more detectors. For example, a detector may be formed from at least one disconnect link 40 that is actuated by a respective disconnect actuator 41. The disconnect link 40 is disconnected substantially at the same time the pair of biased contacts 26, 27 are disconnected in order to indicate that the medium to high voltage monitoring circuit 3 is open. In one exemplary embodiment the respective disconnect actuator 41 may be an insulated mechanical pushrod (e.g., made of polypropylene, polyethylene or any other suitable material) that extends inside the biasing springs 29 and contacts the pair of biased contacts 26, 27. The respective disconnect actuator 41 is mechanically displaced by the pair of biased contacts 26, 27 when the finger 20 is inserted into the aperture 10 sufficiently far that the finger 20 separates the pair of biased contacts 26, 27 and opens the circuit 3. The movement of the insulated mechanical pushrod causes the disconnect actuator 41 to be opened, thereby sending a signal to the interface monitoring circuitry 55 and eventually to the supervisory system 99 that indicates the pair of biased contacts 26, 27 are disconnected.

Opening any disconnect link 40 initiates a remote alarm via an external I/O module 50 that is connected to the interface testing devices 1 through a wired connection. The alarm may be continuous, periodic or any other kind of desired alarm. The configuration of each interface module 2 allows the use of three independent sensors employing two different and independent detection methods for determining the status of the medium to high voltage monitoring circuit 3 being tested, which may be used individually or in combination in the detector. The goal of such redundancy is to guarantee a higher level of safety that is often desirable in facilities such as nuclear power generation plants, chemical plants and the like. The at least one internal disconnect link 40 is placed in a way to send the status signal for the medium to high voltage monitoring circuit 3 at or substantially at the exact moment that the medium to high voltage monitoring and control circuit 3 is opened or closed, thereby avoiding false signalling. The signalling link chamber and the finger 20 follow the insulation specifications for such an interface test device 1.

Every time the medium to high voltage monitoring and control circuit 3 is opened due to the insertion of a test plug 15, an internal disconnect link 40 is opened by the respective disconnect actuator 41 that is installed perpendicular to an insertion direction of a test plug finger 20 between the pair of biased contacts 26, 27. The insertion creates a displacement of the pair of biased contacts 26, 27 that is transferred to the respective disconnect actuator 41, which is configured to open the respective disconnect link 40.

The interface module 2 according to the invention also allows the use of one or two internal disconnect links 40 for signalling the same or similar events. This provides redundancy that reduces the risk of not signalling a safety critical event. When using two internal disconnect links 40, one of the two internal disconnect links 40 is placed on one side of the test block 5, and the other disconnect link 40 is placed on the other side of the test block 5 in such a way that when the test plug 5 is inserted, the pair of biased contacts 26, 27 move towards the internal disconnect links 40, which are opened by the respective disconnect actuators 41 that extend inside the biasing springs 29. These two internal disconnect links 40 are connected in series, so that when one disconnect link 40 is open, the medium to high voltage circuit 3 is presumed open.

According to another exemplary embodiment of the invention a light source 60 and its associated light sensor 61 may be included in the detector and may be placed adjacent to the aperture 10 of the test block 5 in order to detect the insertion of the test plug 15 or any other object that could eventually separate the pair of biased contacts 26, 27, but might not create enough displacement to cause the respective disconnect actuator 41 to open at least one disconnect link 40. The light source 60 and its associated light sensor 61 are independent from any other detectors and the signal from the light sensor 61 is transmitted to the interface monitoring circuitry 55. When the light sensor 61 does not receive a specified amount of light from the light source 60, its signal to the interface monitoring circuitry 55 indicates an obstruction that results in an alarm being indicated by the supervisory system 99. The light source 60 and light sensor 61 may be placed in each interface module 2 or a single light source 60 and light sensor 61 may be placed in a block of interface modules 2.

Figure 4:
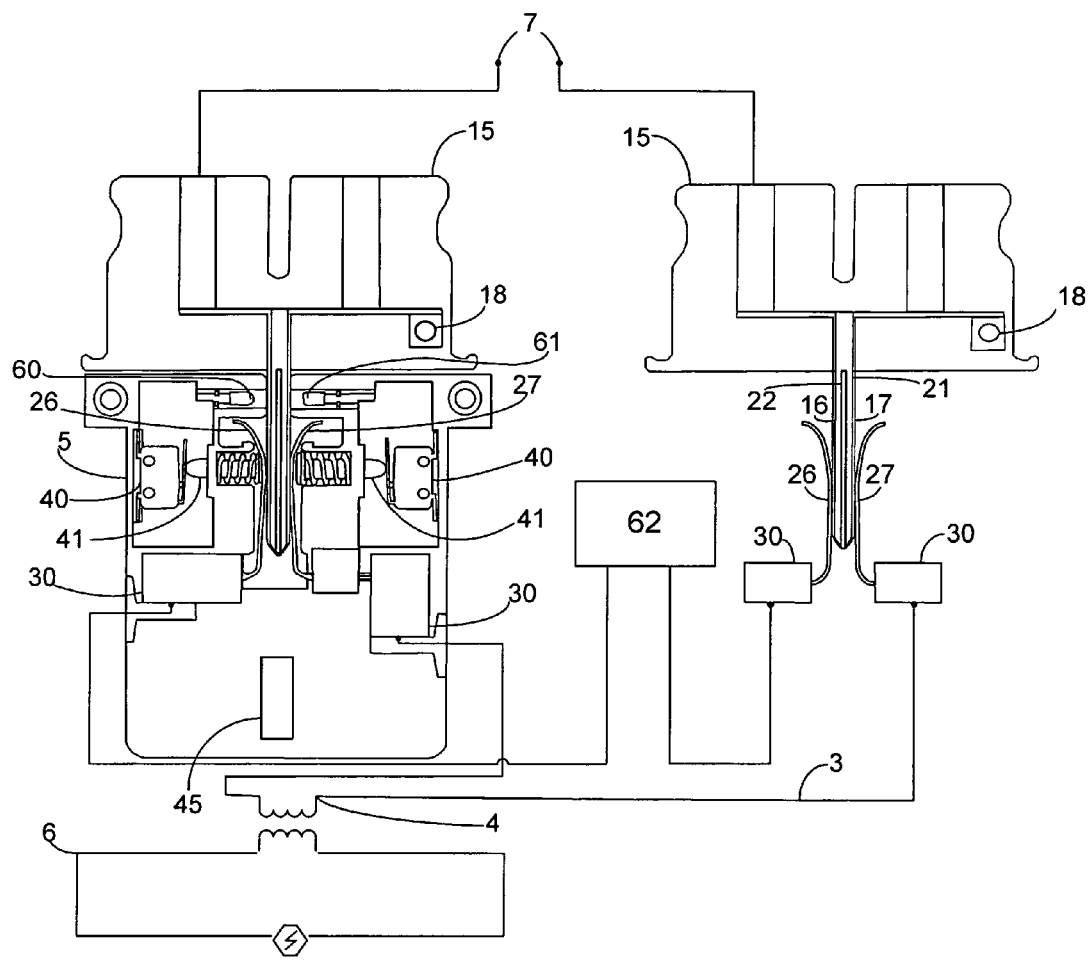
FIG. 4 illustrates the interface test device where the test plugs are fully inserted into the test blocks.

FIG. 4 illustrates the interface module 2 of FIG. 1 with the test plugs 15 fully inserted into the test blocks 5. The test plug A-side contact 16 connects to the test block A-side biased contact 26 and the test plug B-side contact 17 connects to the test block B-side biased contact 27 of the medium to high voltage circuit 3 and the pair of biased contacts 26, 27 are separated. This means that the test block B-side biased contacts 27 are connected to the test plug B-side contact 17 and thus are grounded by the shorting bar 18 and thus may be used for testing.

Insertion of the test plug 15 farther into the test block 5 as illustrated in FIG. 4 pushes the finger 20 between the pair of biased contacts 26, 27 and separates the pair of biased contacts 26, 27 from each other causing the opening of the medium to high voltage monitoring circuit 3 and thereby connecting to the test circuit 7 and simultaneously isolating the device to be tested in the same motion. The insertion of the finger 20 between the pair of biased contacts 26, 27 occurs against the natural direction of the electric arc opening between the pair of biased contacts 26, 27 and inserts an insulator 21 between the two poles of the pair of biased contacts 26, 27 which guarantees that no electric arc occurs while the pair of biased contacts 26, 27 is being opened. The interface test device 1 is designed to perform a "make-before-break" function, where make means shorting the current transformer ends. This "make-before-break" function provides superior protection for current transformers and other circuit elements. For example, upon insertion of the test plug 15, the pair of biased contacts 26, 27 is automatically short-circuited by the shorting bar 18 along pre-assigned poles, in a single step. The simple, safe, and efficient design of the test plug 15 and the test block 5 provides access to in-service medium to high voltage monitoring and control components 4 and the equipment 62 without interrupting the current path prior or during test plug 15 insertion. The interface test device 1 utilizes "make-before-break" function to maintain electrical system continuity and automatically short circuit medium to high voltage component current channels before opening the medium to high voltage monitoring and control circuit 3. Potential and signal links are disconnected by the test plug 15 with high quality electrical insulation. The single movement of test plug 15 insertion both "makes" and "breaks" the medium to high voltage circuit 3 in a fail-safe sequence that achieves proper isolation and restoration every time. With the test plug 5 inserted as illustrated in FIG. 4, testing and replacement of a defective medium to high voltage monitoring component 4 and of the equipment 62 can be safely performed.

The pair of biased contacts 26, 27 automatically closes upon removal of the test plug 15. For example, the biasing springs 29 that press the pair of biased contacts 26, 27 towards each other guarantee that the medium to high voltage monitoring circuit 3 is closed when the testing procedures are finished.

In FIG. 2, FIG. 3 and FIG. 4, whether the test plugs 15 are not inserted, partially inserted or fully inserted provides different signals to the supervisory system 99. In FIG. 2, which illustrates an interface module 2 during normal operation where the various circuits are closed. In this case the status will be OK and there is no alarm from the supervisory system 99. In FIG. 3, which illustrates an interface module 2 just prior to test mode operation, light from the light source 60 will not reach its associated light sensor 61 which results in an obstruction being indicated to the supervisory system 99. In this case the status will be ALARM and there will be alarm indicated by the supervisory system 99. In FIG. 4, which illustrates an interface module 2 during test mode operation, light from the light source 60 will not reach its associated light sensor 61 which results in an obstruction being indicated the supervisory system 99 and the pair of biased contacts 26, 27 are separated which also will be indicated to the supervisory system 99. In this case the status will be ALARM and there will be alarm indicated by the supervisory system 99.

The use of multiple test plugs 15 allows for the testing of portions of the test circuit 7. Alternatively, if the entire test circuit is to be tested, a single test plug may be used.

Figure 10:
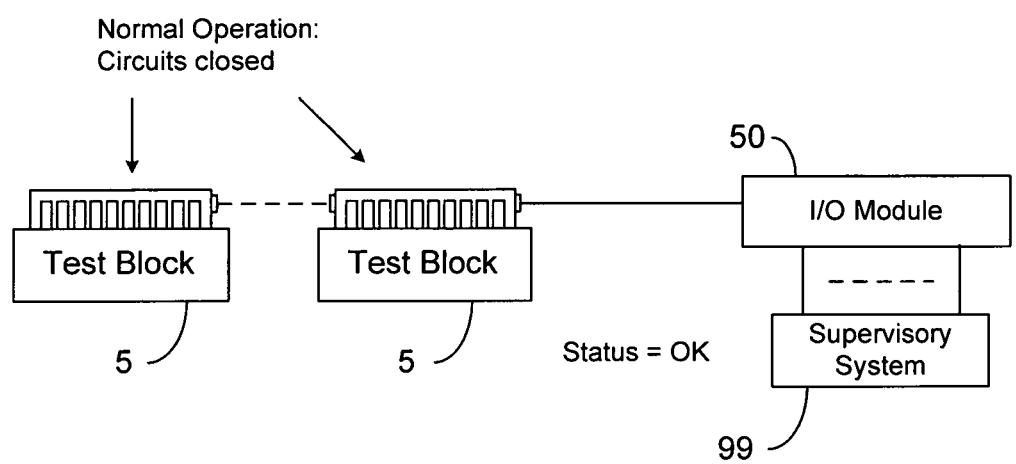
FIG. 10 illustrates normal operation over a plurality of test blocks.
Figure 11:
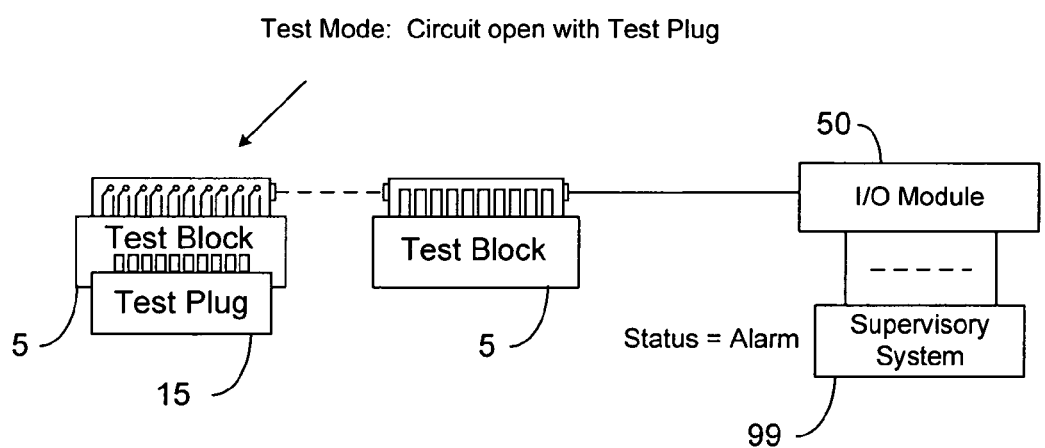
FIG. 11 illustrates test mode operation utilizing a test plug in one test block over a plurality of test blocks.
Figure 12:
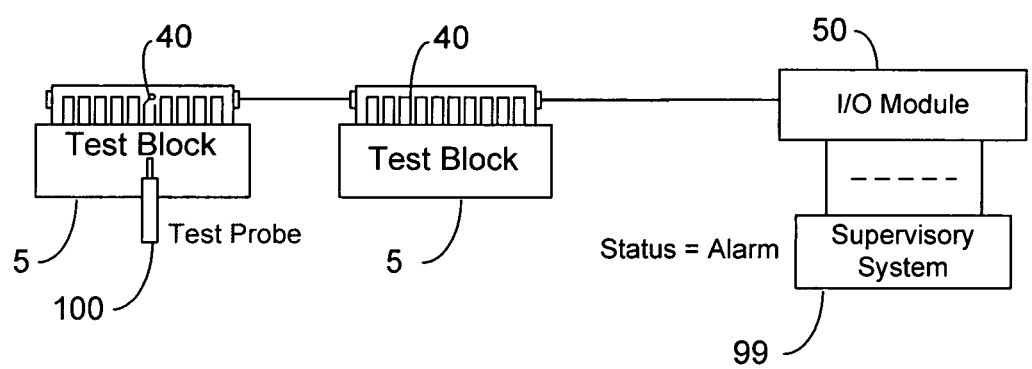
FIG. 12 illustrates test mode operation utilizing a test probe in one test block over a plurality of test blocks.

FIG. 10 illustrates normal operation over a plurality of test blocks 5. FIG. 11 illustrates test mode operation utilizing a test plug 15 in one test block over a plurality of test blocks 5. FIG. 12 illustrates test mode operation utilizing a test probe 100 in one test block over a plurality of test blocks 5.

Figure 5:
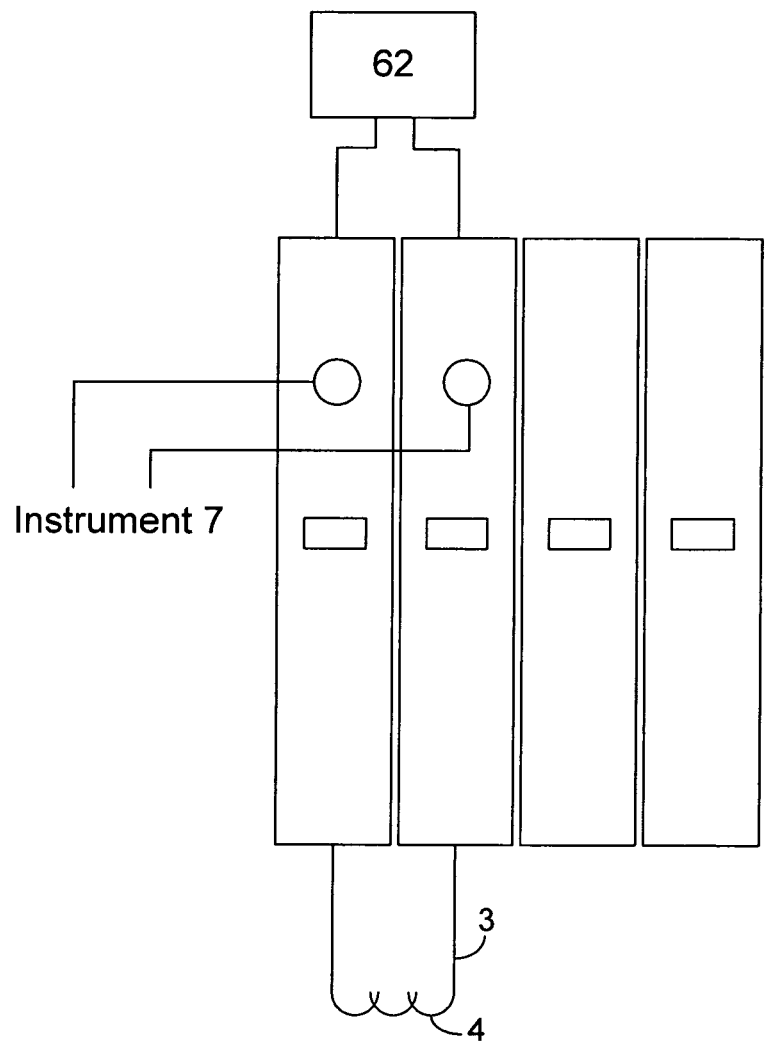
FIG. 5 illustrates a front view of two poles of the test block connected to a current transformer and to a measuring instrument.

FIG. 5 illustrates a front view of two poles of the test block connected to a current transformer and to a measuring instrument. The labels 8 designate the plug contacts for the test instrument 7.

Figure 6:
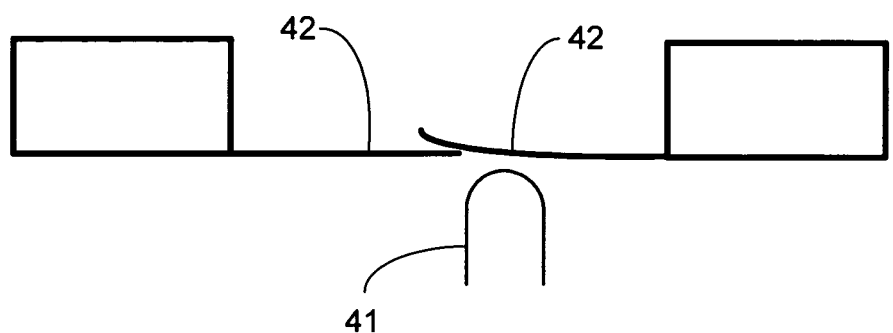
FIG. 6 illustrates a normally closed blade switch in the closed position that may be used as the disconnect link.
Figure 7:
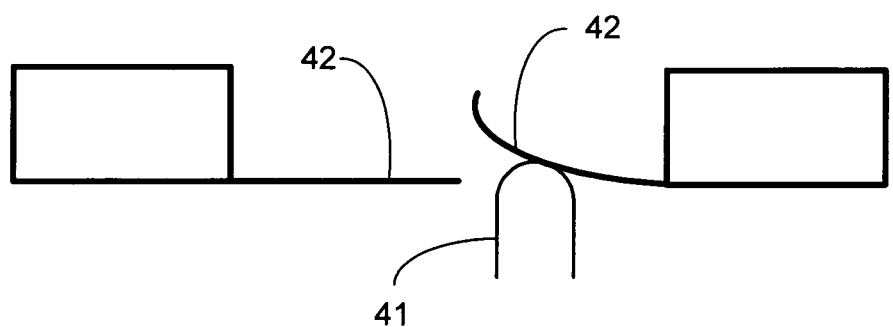
FIG. 7 illustrates the normally closed blade switch of FIG. 5 in the open position.

FIG. 6 illustrates a normally closed blade switch 42 in the closed position that may be used as the disconnect link 40. Alternatively, other mechanical switches, capacitive switches and inductive switches may also be used or any other suitable disconnect link may be used. The disconnect link 40 opens a circuit in the interface monitoring circuitry 55. Each open pair of biased contacts 26, 27 causes at least one disconnect link 40 to open, which is built-in into the test block 5. The internal disconnect link 40 may be formed of two blades 42 that are touching each other in their resting position, allowing current to flow through the interface monitoring circuitry 55. When the respective disconnect actuator 41 that contacts one of the pair of biased contacts 26, 27 is displaced substantially perpendicular to the insertion movement of the finger 20, the respective disconnect actuator 41 opens the disconnect link 40 and thereby causes the monitoring circuitry 55 to indicate that the pair of biased contacts 26, 27 is open. FIG. 7 illustrates the normally closed blade switch 42 of FIG. 6 in the open position.

Figure 8:
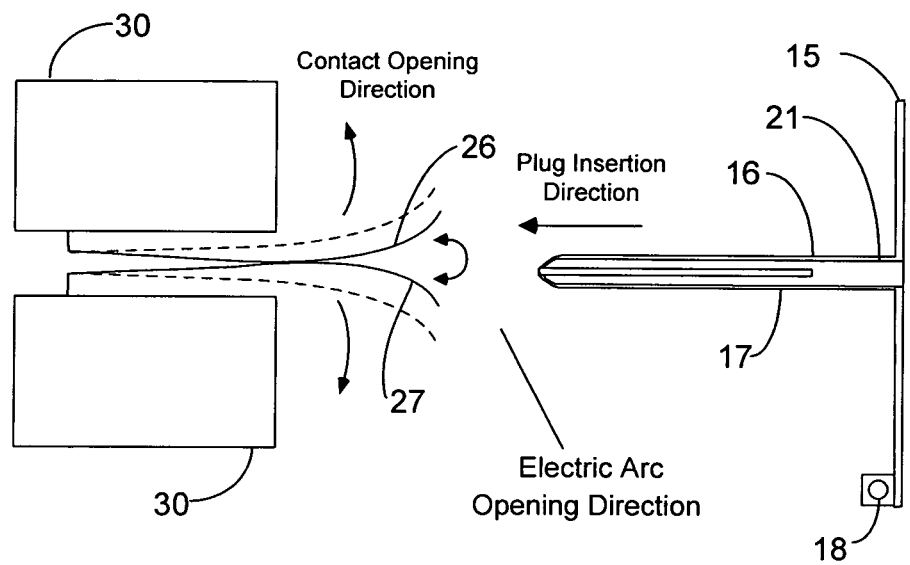
FIG. 8 illustrates an arc prevention feature of the invention during test plug insertion.
Figure 9:
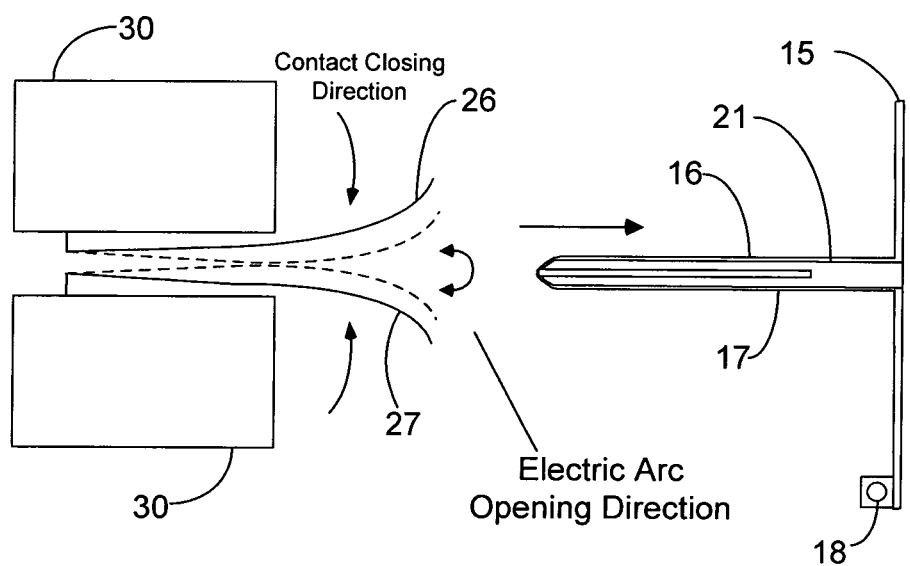
FIG. 9 illustrates an arc prevention feature of the invention during test plug removal.

FIG. 8 illustrates an arc prevention feature of the invention during test plug 15 insertion while FIG. 9 illustrates an arc prevention feature of the invention during test plug 15 removal. According to FIG. 8, the generation of arcs is prevented because the insertion of the pair of test plug contacts 16, 17 and the insulator 21 of the test plug 15 between the contacts 26, 27 occurs against the natural direction of the electric arc opening. Similarly, when disconnecting the pair of test plug contacts 16, 17 from the pair of biased contacts 26, 27, the generation of arcs is prevented because the contacts are closing in the opposite direction of the arc opening.

Figure 13:
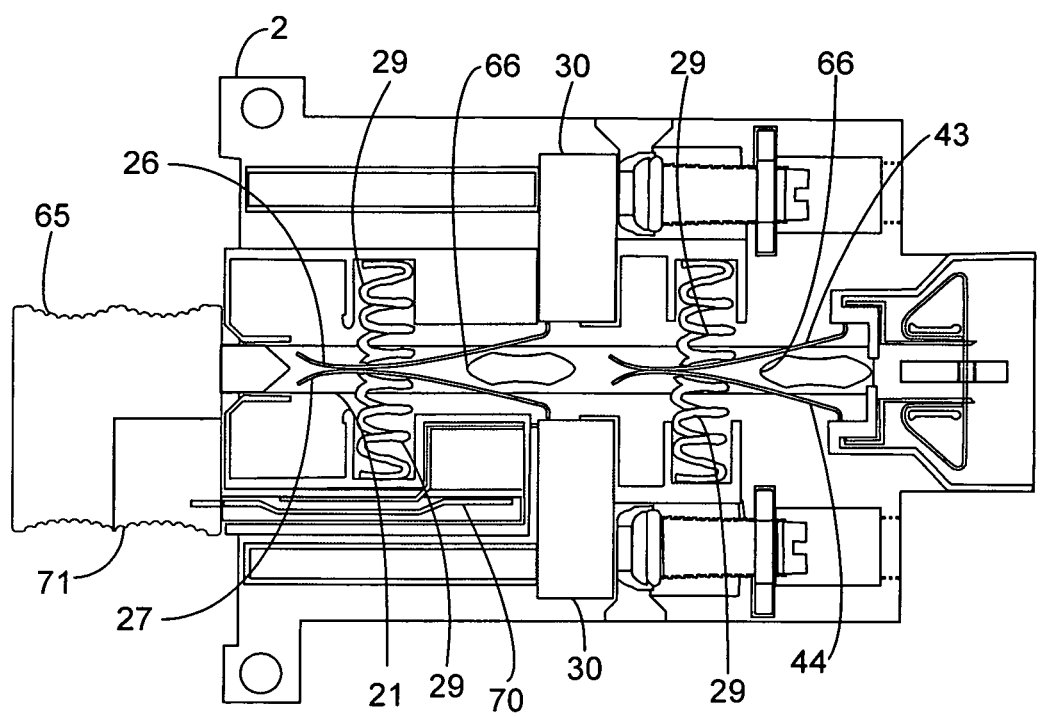
FIG. 13 illustrates another exemplary embodiment of the interface module with a breaker finger that moves within the interface module but cannot be removed from the interface module that is in the normal operational mode.

FIG. 13 illustrates another exemplary embodiment of the interface module 2 with a breaker finger 65 that moves within the interface module 2 but cannot be removed from the interface module 2 that is in the normal operational mode. This embodiment provides safety against the insertion of foreign objects and protects the interface module 2 against dust and moisture because the module 2 does not have any apertures that are open to the outside.

There are two contact pairs in the interface module 2 of FIG. 13. The first is the pair of biased contacts 26, 27 that is configured to open and close the medium to high voltage monitoring circuit 3. The pair of biased contacts 26, 27 is opened by the breaker finger 65 that includes an insulator 21. The breaker finger 65 that breaks the medium to high voltage monitoring circuit 3 is integral to the interface module 2. When the breaker finger 65 is in "rest" position at the module as illustrated in FIG. 13, current is flowing in the medium to high voltage monitoring circuit 3 through the pair of biased contacts 26, 27 which are closed. The second contact pair 43, 44 forms a normally closed disconnect link 40 which is to open and close the interface monitoring circuitry 55. When the breaker finger 65 is in "rest" position at the module 2, a monitoring current is flowing in the interface monitoring circuitry 55 through the closed contact pair 43, 44.

Figure 14:
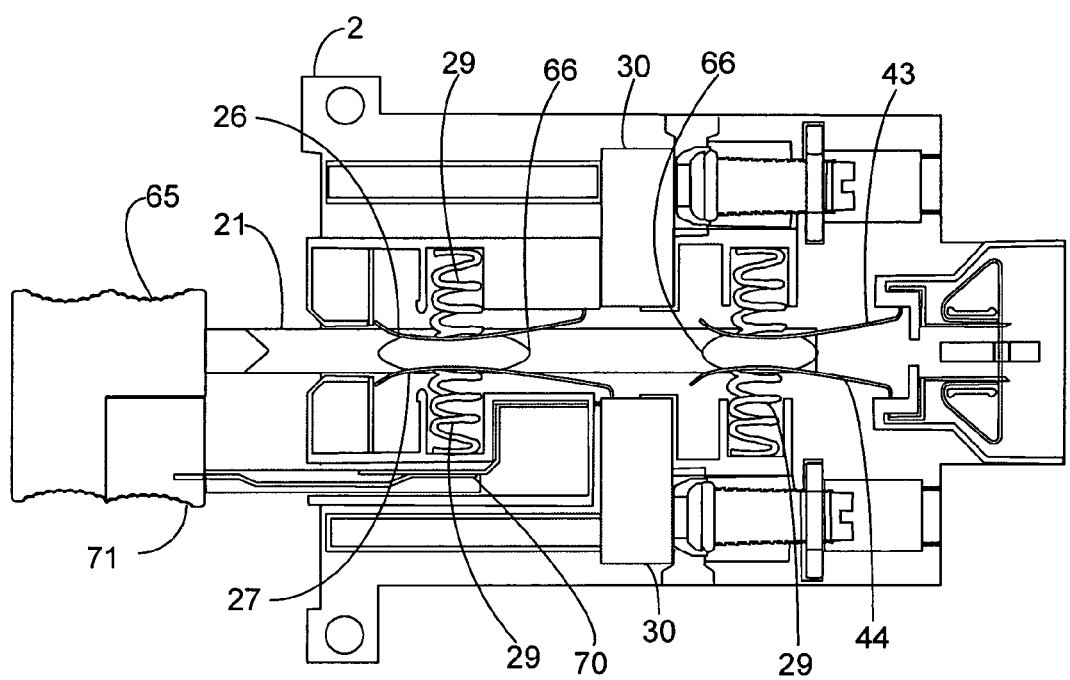
FIG. 14 illustrates another exemplary embodiment of the interface module with a breaker finger that moves within the interface module but cannot be removed from the interface module that has a breaker finger and a shorting contact slide pulled out.

FIG. 14 illustrates another exemplary embodiment of the interface module 2 with a breaker finger 65 that moves within the interface module 2 but cannot be removed from the interface module 2 that has a breaker finger 65 and a shorting contact slide 71 pulled out. The breaker finger 65 slides back and forth between the "rest" position for normal operation as is illustrated in FIG. 13 or in a "pulled" position or testing mode as is illustrated in FIG. 14. The breaker finger 65 is retained in the module 2 and is never removed from the module 2. When the breaker finger 65 is pulled into the position illustrated in FIG. 14, the insulator 21 is pulled between the pair of biased contacts 26, 27 initially with the insulator wedge 66 to separate them and thereby break the medium to high voltage circuit 3. As shown in FIG. 14, the insulator 21 is retained between the pair of biased contacts 26, 27 at the insulator wedge 66 in the center of the insulator 21 through the friction generated by the contact pressure of the pair of biased contacts 26, 27 and by the retaining force of the contacts against walls of the insulator wedge 66. The second contact pair 42, 43 forms the disconnect link 40 for signalling the status of the pair of biased contacts 26, 27. When the breaker finger 65 is pulled from the position illustrated in FIG. 13 to the position illustrated in FIG. 14, the insulator wedge 66 is also pulled between the second contact pair 42, 43 to separate them and to break the interface monitoring circuitry 55. As illustrated in FIG. 14, the insulator 21 is retained between the second contact pair 42, 43 at the insulator wedge 66 in the center of the insulator 21 through the friction generated by the contact pressure of the second contact pair 42, 43. The second contact pair 42, 43 forms the disconnect link 40 for the interface monitoring circuitry 55.

When the breaker finger 65 is pulled as illustrated in FIG. 14, the second contact pair 42, 43 is opened substantially simultaneously with the pair of biased contacts 26, 27 and breaks the circuit of the interface monitoring circuitry 55, which sends an alarm signal through the I/O module 50 on the electronic circuit board 45 to the supervisory system 99.

Figure 15:
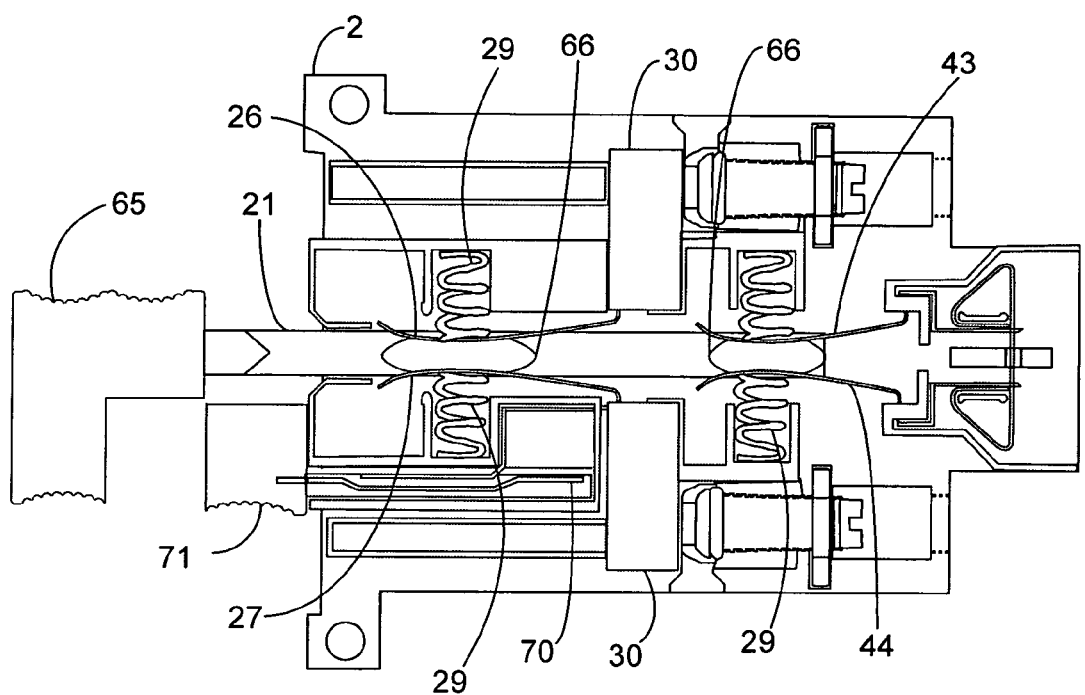

For current carrying medium to high voltage monitoring circuits 3 the "make-before-break" mechanism is implemented by a shorting contact 70 that is closed before the pair of biased contacts 26, 27 open the medium to high voltage circuit 3 as illustrated in FIG. 14. The shorting contact 70 connects the medium to high voltage monitoring and control circuit 3. This position where the breaker finger 65 and the shorting contact slide are locked together is used for disconnecting the current transformer and for assuring make-before-break. In order to open the medium to high voltage monitoring and circuit 3 for measurement and testing, the shorting contact 70 has to be moved back to the module and opened as shown in FIG. 15. The shorting contact 70 is moved by the shorting contact slide 71, which is locked to the breaker finger 65 during normal operation. In order to open the medium to high voltage monitoring circuit 3, the shorting contact slide 71 has to be unlocked from the breaker finger in as illustrated in FIG. 15 and moved back to the module 2. Before the shorting contact slide 71 is moved back towards the module 2, the user has to assure that a correct measuring instrument is connected to the contacts 26, 27.

In order to open the medium to high voltage monitoring circuit 3, the breaker finger 65 at the interface module 2 must be pulled, the shorting contact slide 71 must be unlocked from the breaker finger 65, and the shorting contact slide 71 must be moved back towards the interface module 2. Having to perform these 3 actions, which cannot be performed inadvertently, provides a high level of safety that assures that the medium to high voltage monitoring circuit 3 is not opened inadvertently. Table 1 lists the possible positions of the breaker finger 65 and the shorting contact slide 71 and the corresponding open or closed condition of the medium to high voltage circuit 3. It is impossible for the breaker finger 65 to be in the rest position when the shorting contact slide 71 is in the pull position, thereby ensuring proper operation of the interface module 2.

TABLE 1

| Breaker Finger 65 | Shorting contact slide 71 | Medium to High Voltage Monitoring Circuit 3 |
| --- | --- | --- |
| Rest | Rest | Closed |
| Pulled | Pulled | Closed |
| Pulled | Rest | Open |

Multiple disconnect links 40 of interface testing devices 1 may be interconnected one after another by a pair of wires, creating a network of as many units as the power supply in use can handle. Each disconnect link is connected in series through circuit board 45 which can be attached at each interface module 2. When one of the disconnect links in the chain is open, the electrical current flowing through the interface monitoring circuitry 55 is interrupted and an I/O module 50 placed on the circuit board signals this event to a monitoring system via a communication protocol. The monitoring circuitry 55 includes an I/O module 50 on an electronic circuit board 45, which is mechanically connected to the interface module 2 and electrically connected to the monitoring circuitry 55. The monitoring circuitry 55 actuates an alarm that indicates that the pair of biased contacts 26, 27 of the medium to high voltage monitoring and control system 3 is open. Current provided by the I/O module 50 flows through the monitoring circuitry 55. This flow is interrupted when a plug is inserted actuating any one of the disconnected links. The I/O module that supplies the power detects the interruption and then signals the event to the monitoring system to which it is connected.

Figure 16:
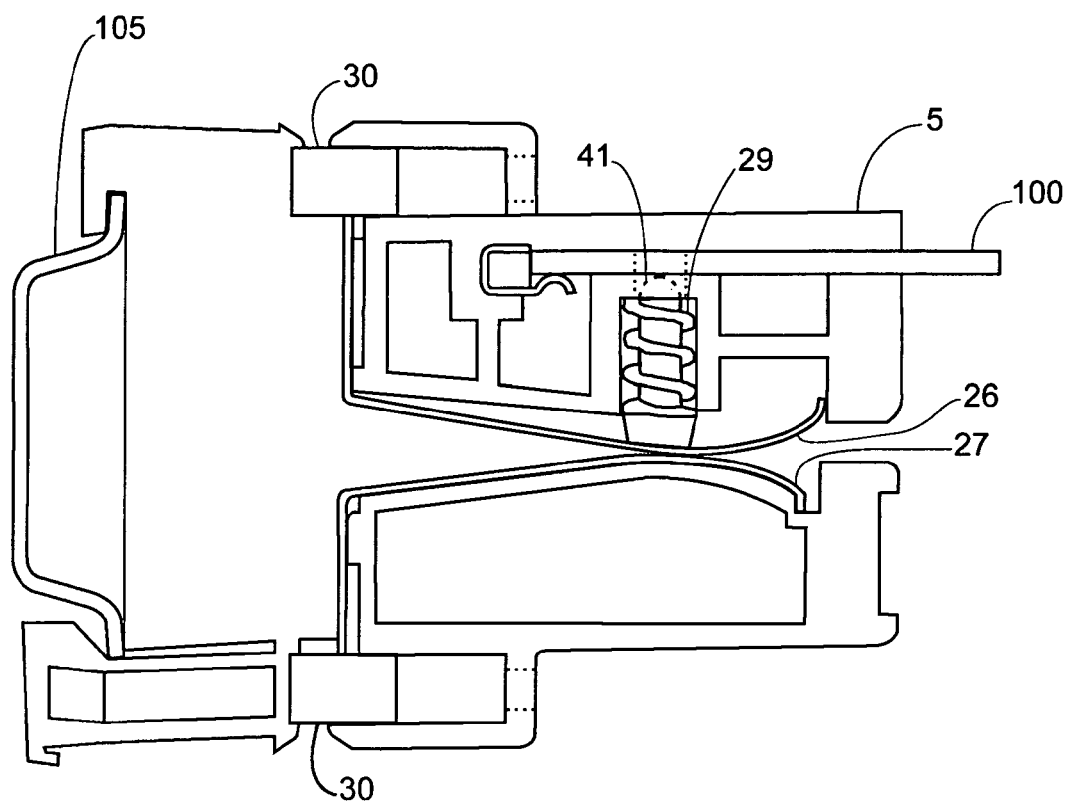
FIG. 16 illustrates another exemplary embodiment of the interface module with a front circuit board and a DIN rail for support.

FIG. 16 illustrates another exemplary embodiment of the interface module 2 with a front circuit board 100 and a rear support 105 such as a DIN rail. By using a front circuit board 100 and a rear support 105, maintenance, repair and replacement of the front circuit board 100 is simplified as compared to embodiments with a rear circuit board 45. For example, access to the front circuit board 100 is not dependent upon what other elements are around the front circuit board 100 whereas access to the rear circuit board 45 may be hindered by other elements proximate to or in front of the rear circuit board 45. Additionally, the use of a standard rear support 105 and a front circuit board 100 in each interface module 2 allows the use of diverse interface modules 2 without the need to be concerned with whether the maintenance, repair and replacement of the front circuit boards 100 will be impeded by the other elements of that interface module 2, by the adjacent interface modules 2, or by the space into which all of the interface modules 2 are located. The use of a standard rear support 105 standardizes the interface modules 2 such that upgrades and diverse modules may be made utilized without additional design constraints.

Although several embodiments of the present invention and its advantages have been described in detail, it should be understood that changes, substitutions, transformations, modifications, variations, permutations and alterations may be made therein without departing from the teachings of the present invention, the spirit and the scope of the invention being set forth by the appended claims.

What is claimed is:

1. An interface test device for testing a circuit, the interface test device comprising:
    a module configured to open and close a medium to high voltage monitoring circuit, the module having
        at least one pair of contacts biased towards each other that are electrically connected and in line with the medium to high voltage monitoring circuit, and
        a detector; and
    a test circuit,
    wherein the test circuit is connected to the medium to high voltage monitoring circuit before or substantially simultaneously with the medium to high voltage monitoring circuit being opened;
    wherein the module is configured to provide at least one output based upon at least one parameter of the medium to high voltage monitoring circuit to the test circuit in order to measure the at least one parameter by an external tester connected to the test circuit; and
    wherein the detector determines whether the at least one pair of contacts are in conductive contact with each other and provides a detector output indicating whether the at least one pair of contacts are in conductive contact with each other such that when the at least one pair of contacts changes from being in conductive contact with each other to not being in conductive contact with each other or changes from not being in conductive contact with each other to being in conductive contact with each other the detector changes the detector output.

2. The device of claim 1, wherein the medium to high voltage monitoring circuit may be serviced for maintenance without being interrupted.

3. The device of claim 1, wherein the detector determines whether an object has been inserted into an aperture in the module.

4. The device of claim 3, wherein the object is a finger of the module.

5. The device of claim 3, wherein the object is not a finger of the module.

6. The device of claim 1, wherein the detector determines a position of at least one contact of the at least one pair of contacts.

7. The device of claim 6, wherein the detector determines whether a third circuit is in an open or in a closed state at substantially the same time the open or the closed state occurs.

8. The device of claim 1, further comprising monitoring circuitry.

9. The device of claim 8, wherein the monitoring circuitry is integrated with the module.

10. The device according to claim 8, wherein the monitoring circuitry receives an input from the detector and converts it into a predetermined communication protocol.

11. The device according to claim 8, wherein the monitoring circuitry is located towards a front of the interface test device.

12. An interface test device for testing a circuit, the interface test device comprising:
    a module configured to open and close a medium to high voltage monitoring circuit, the module having
        at least one pair of contacts biased towards each other that are electrically connected and in line with the medium to high voltage monitoring circuit, and
        monitoring circuitry;
    a test circuit; and
    a detector,
    wherein the test circuit is connected to the medium to high voltage monitoring circuit before or substantially simultaneously with the medium to high voltage monitoring circuit being opened; and
    wherein the module is configured to provide at least one output based upon at least one parameter of the medium to high voltage monitoring circuit to the test circuit in order to measure the at least one parameter by an external tester connected to the test circuit,
    wherein the detector determines whether the at least one pair of contacts are in conductive contact with each other and provides a detector output indicating whether the at least one pair of contacts are in conductive contact with each other such that when the at least one pair of contacts changes from being in conductive contact with each other to not being in conductive contact with each other or changes from not being in conductive contact with each other to being in conductive contact with each other the detector changes the detector output.

13. The device of claim 12, wherein the medium to high voltage monitoring circuit may be serviced for maintenance without being interrupted.

14. The device of claim 12, wherein the detector determines a position of at least one of the pair of contacts.

15. The device of claim 12, wherein the detector determines whether a third circuit is in an open or in a closed state at substantially the same time the open or the closed state occurs.

16. The device of claim 12, wherein the detector detects whether an object has been inserted into an aperture in the module.

17. The device of claim 16, wherein the object is a finger of the module.

18. The device of claim 16, wherein the object is not a finger of the module.

19. The device of claim 12, wherein the monitoring circuitry is integrated with the module.

20. The device of claim 12, wherein the monitoring circuitry may be serviced for maintenance without opening the medium to high voltage monitoring circuit.

21. The device according to claim 12, wherein the monitoring circuitry receives an input from the detector and converts it into a predetermined communication protocol.

22. The device according to claim 7, wherein the monitoring circuitry is located towards a front of the interface test device.

* * * * *